United States Patent
Cameron et al.

[19]

[11] Patent Number: 5,811,910
[45] Date of Patent: Sep. 22, 1998

[54] MECHANICAL SHOCK SENSOR

[76] Inventors: Graham P. Cameron, 13654 Elkwood Dr., Apple Valley, Minn. 55112; Jeffrey S. Haviland, 29427 Kiwi Ct., St. Joseph, Minn. 56374

[21] Appl. No.: 790,814

[22] Filed: Jan. 30, 1997

[51] Int. Cl.$^6$ .................................................. H01L 41/08
[52] U.S. Cl. .......................... 310/324; 310/329; 310/338; 73/514.01
[58] Field of Search .................................. 310/324, 328, 310/329, 338; 73/514.01

[56] References Cited

U.S. PATENT DOCUMENTS

| | | | |
|---|---|---|---|
| 4,047,060 | 9/1977 | Schafft | 310/322 |
| 4,051,395 | 9/1977 | Taylor | 310/329 |
| 4,051,455 | 9/1977 | Fowler | 340/9 |
| 4,170,742 | 10/1979 | Itagaki et al. | 310/324 |
| 4,315,433 | 2/1982 | Edelman et al. | 310/329 |
| 4,354,134 | 10/1982 | Micheron | 310/800 |
| 4,424,465 | 1/1984 | Ohigashi et al. | 310/335 |
| 4,658,154 | 4/1987 | Harnden et al. | 307/132 R |
| 4,821,584 | 4/1989 | Lembke | 310/338 |
| 4,851,080 | 7/1989 | Howe et al. | 156/647 |
| 4,872,335 | 10/1989 | Tsuruoka et al. | 73/30 |
| 4,972,713 | 11/1990 | Iwata | 310/329 |
| 5,038,069 | 8/1991 | Lukasiewicz et al. | 310/338 |
| 5,053,671 | 10/1991 | Kobayashi et al. | 310/329 |
| 5,063,782 | 11/1991 | Kellett | 310/329 |
| 5,117,696 | 6/1992 | Schmid | 310/329 |
| 5,118,981 | 6/1992 | Kobayashi et al. | 310/329 |
| 5,128,581 | 7/1992 | Nakayama et al. | 310/329 |
| 5,130,600 | 7/1992 | Tomita | 310/329 |
| 5,339,290 | 8/1994 | Greenstein | 310/324 |
| 5,349,867 | 9/1994 | Park | 73/727 |
| 5,383,364 | 1/1995 | Takahashi et al. | 73/517 R |
| 5,432,395 | 7/1995 | Grahn | 310/328 |
| 5,437,196 | 8/1995 | Okada | 73/862.043 |
| 5,571,972 | 11/1996 | Okada | 73/862.043 |
| 5,679,897 | 10/1997 | Matsumoto et al. | 73/514.34 |
| 5,748,567 | 5/1998 | Mori et al. | 367/178 |

*Primary Examiner*—Thomas M. Dougherty
*Attorney, Agent, or Firm*—Palmatier, Sjoquist, Voigt & Christensen, P.A.

[57] ABSTRACT

A mechanical shock sensor including a diaphragm suspended about its edge to an elevated pedestal and a pattern of piezoelectric material attached to the diaphragm surface. A proof mass is attached beneath the diaphragm surface and centered along a vertical axis passing through the diaphragm and the concentric piezoelectric materials. Electrical conductors are attached to the first and second concentric electrically conductive layers on piezoelectric material and are connected to a circuit capable of responding to the piezoelectric signals developed thereby.

13 Claims, 3 Drawing Sheets

MECHANICAL SHOCK SENSOR

The present invention is related to an apparatus for sensing mechanical shock; in particular, the invention relates to sensing shock forces which may occur in any direction.

BACKGROUND OF THE INVENTION

Mechanical shock sensors are frequently used for monitoring and/or recording mechanical shock forces imparted to a fragile object under test or investigation, where the shock forces of interest are monitored for their shock magnitudes rather than direction. One frequent use of mechanical shock detection devices is in the field of shipping wherein such sensors may be incorporated into the packaging of goods for shipping and transportation and wherein the sensor will provide an indication of possible damage which occurs during shipment as a result of rough handling. Since prior art shock sensors are frequently responsive to forces in only a single direction, it is necessary to use two or three shock sensors to monitor shock forces when it is desired to learn the magnitude of shock forces along two or three independent axes. For example, if the shock forces are measured along three orthogonal axes, the readings of the three measuring devices can be algebraically combined to calculate the magnitude and direction of the largest shock forces. Unfortunately, this technique requires the use of multiple sensors and some amount of post-processing before the measured quantities can be reliably determined.

Prior art shock sensors are frequently accelerometers utilizing sensing material placed on a thin diaphragm with a proof mass attached to the diaphragm. Some prior art devices utilize materials having a piezoelectric effect, wherein the proof mass is carefully balanced above and below the diaphragm to avoid cross-axes sensitivity. It is well known that piezoelectric materials produce electric impulses in response to pressure applied to the material. Such materials may utilize dielectric polarization along a known direction of the piezoelectric material, frequently a ceramic or polymer, wherein connectors are affixed to the material in appropriate locations. The electrical signals which are generated by the material are connected to and processed through appropriate control circuitry. Piezoelectric materials may include such materials as polyvinylidene fluoride (PVDF), copolymers of vinylidene fluoride (VDF) and trifluoroethylene (TrFE), as well as certain ceramic materials.

In the prior art, it is typical that mechanical shock sensing devices of the types described above aligned along three mutually orthogonal axes, and the output signals from such devices are combined by using complex mathematical or electronic algorithms to determine the magnitude of the shock. However, the prior art does not teach the use of an unbalanced proof mass to create sensitivity in all three axes (X, Y and Z) for generating a single signal representative of shock sensor magnitude.

It is a principal object of the present invention to provide a low cost, non-directional shock sensor which provides electrical signals representative of the shock magnitude, regardless of direction.

It is another object and advantage of the present invention to utilize an unbalanced proof mass in combination with a relatively thin membrane diaphragm to achieve the requisite shock sensor signal.

Other objects and advantages of the invention will become apparent from the following specification and claims and with reference to the appended drawings.

SUMMARY OF THE INVENTION

A shock detection device having the capability of measuring shock magnitude in any direction. The device includes a thin flexible diaphragm suspended about its edge on an elevated pedestal with piezoelectric material applied to the diaphragm. A proof mass is affixed to the diaphragm proximate its center, and electrical signal connections are made to electrically conductive layer on the piezoelectric material. The electric signal conductors are connected to a detection circuit having a circuit design for receiving and amplifying the piezoelectric signal which is received as a result of the shock deflection of the piezoelectric material.

DESCRIPTION OF THE PREFERRED EMBODIMENT

Figure 1:
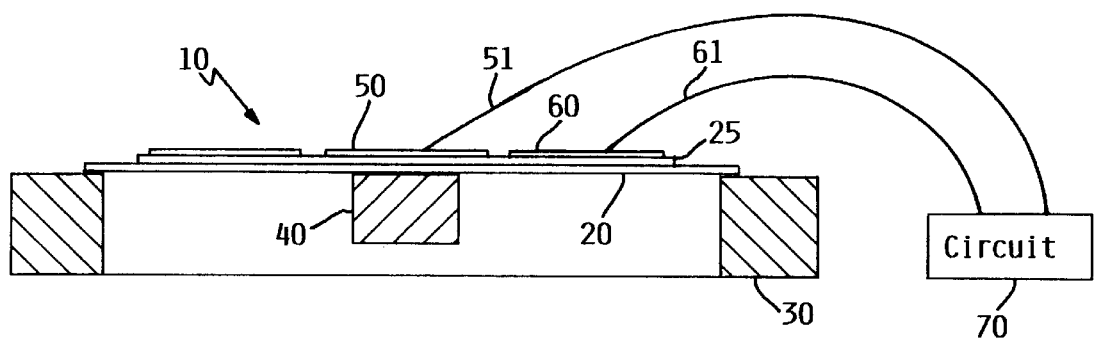
FIG. 1 shows an elevation cross-section view of the invention.

Referring first to FIG. 1, the shock sensor 10 is shown in elevation view and in partial cross section. A diaphragm 20 is suspended along its outer edge on a pedestal 30. Diaphragm 20 is preferably circular in shape and pedestal 30 is preferably ring-shaped, having an interior opening smaller than the other diameter of diaphragm 20. A weight 40 of known mass is suspended proximate to the center of the underside of diaphragm 20 and the upper side of diaphragm 20 is layered with piezoelectric material. Examples of piezoelectric materials which are useful for this application are piezoelectric crystalline or polycrystalline ceramics and lead metal oxides such as $P_bT_iO_3$ or $P_bZ_rO_3$, or certain polymers. The preferred embodiment utilizes a circular piezoelectric material 25. The electrical conductors 50 and 60 for the piezoelectric material are concentrically positioned in spaced-apart relationship. Electrical signal lines 51 and 61 are respectively connected to conductors 50 and 60 and are also connected to a detection circuit 70. Detection circuit 70 is capable of receiving piezoelectric voltage impulses and converting these signals to a signal which is representative of the magnitude of force which causes the piezoelectric material to generate the signals.

Figure 2:
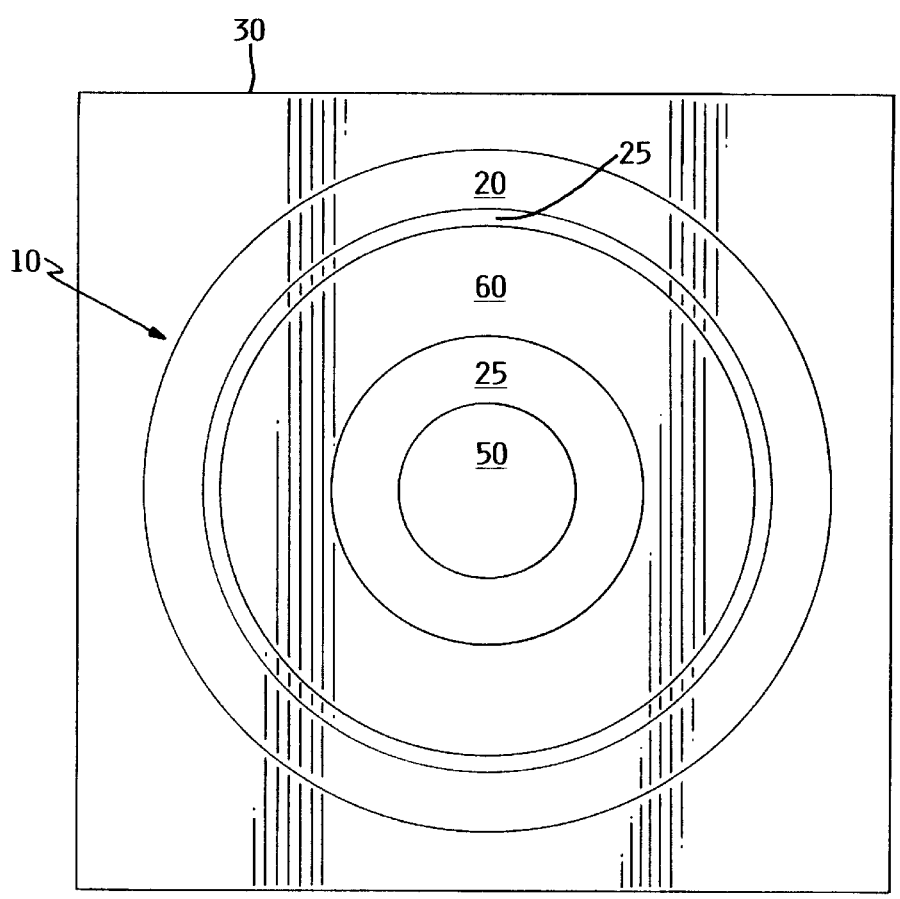
FIG. 2 shows a top view of the invention.

FIG. 2 shows the top view of shock sensor 10 mounted on pedestal 30. Diaphragm 20 is preferably formed in a circular shape and has its respective edges affixed to pedestal 30. Diaphragm 20 may preferably be made from a very thin metallic material such as brass, plated steel, or stainless steel. A preferable thickness range for diaphragm 20 is from 0.1 millimeters (mm) to 0.4 mm. A piezoelectric material 25 is deposited upon or attached to diaphragm 20. A electrically conductive layer 60 is deposited on the piezoelectric layer 25 in the shape of an enlarged ring. A electrically conductive layer 50 is deposited on piezoelectric material 25 in the shape of a circle of diameter smaller than the inner diameter of conductor 60. Electrically conductive layers 50 and 60 are spaced apart leaving a region of piezoelectric material 25 therebetween.

Figure 3:
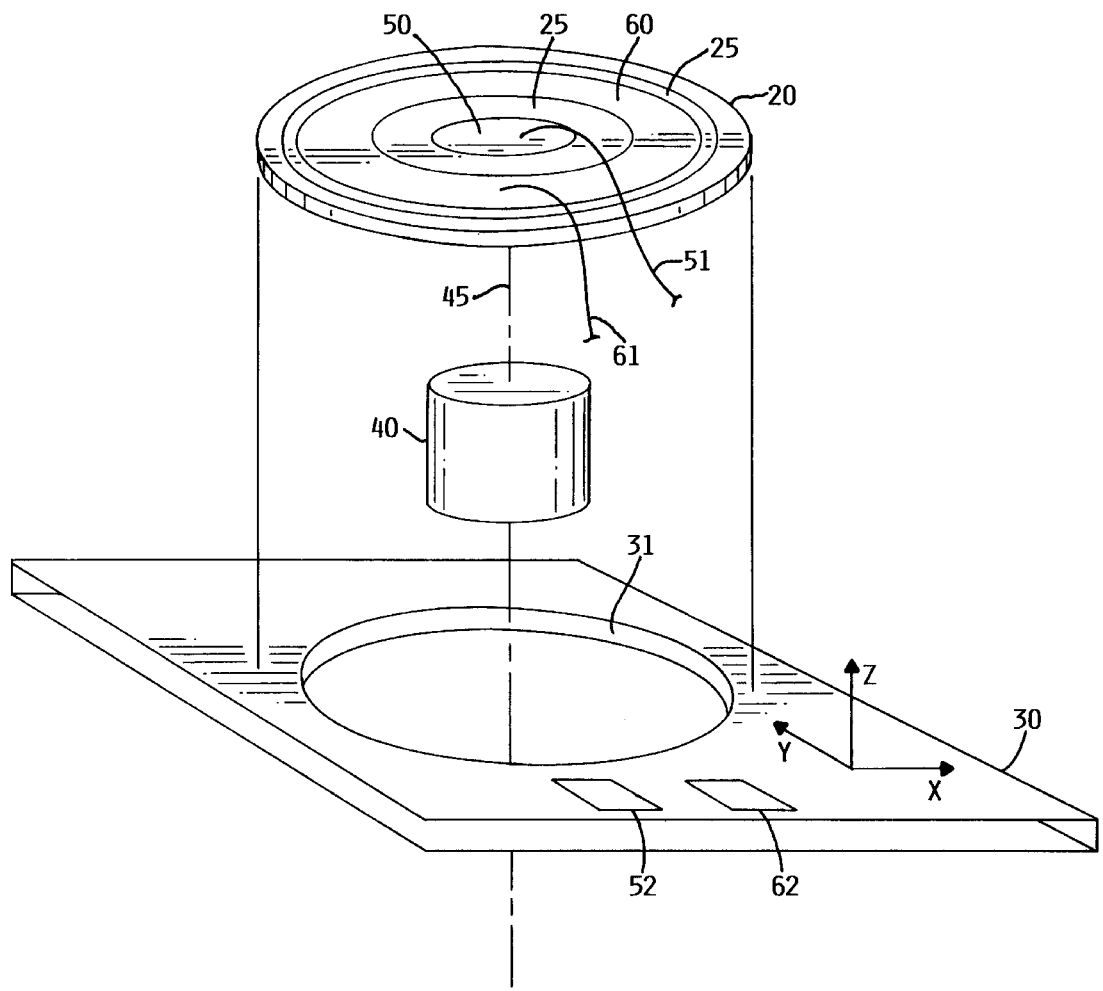
FIG. 3 shows an exploded isometric view of the invention.

FIG. 3 shows an exploded isometric view of the apparatus. Pedestal 30 has an opening 31 formed about an axis 45. Diaphragm 20 is positioned over pedestal 30 and affixed thereto, also centered about axis 45. A weight 40 is affixed to the undersurface of diaphragm 20 along axis 45, and is suspended in the opening 31 of pedestal 30. Pedestal 30 may take the form of a circuit board with an appropriate opening, or may be part of a transducer housing or package. The electrical conductors 51 and 61 are respectively connected to conductive tabs 52 and 62 which are conveniently positioned on top of pedestal 30, for subsequent connection to a circuit 70.

Figure 4A:
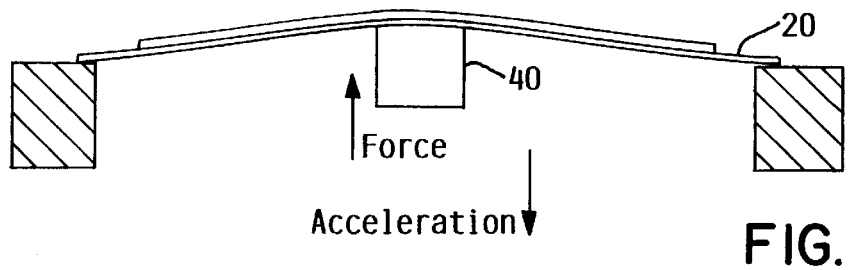
FIG. 4A shows a diagrammatic view of the invention in response to a vertical downward applied acceleration.
Figure 4B:
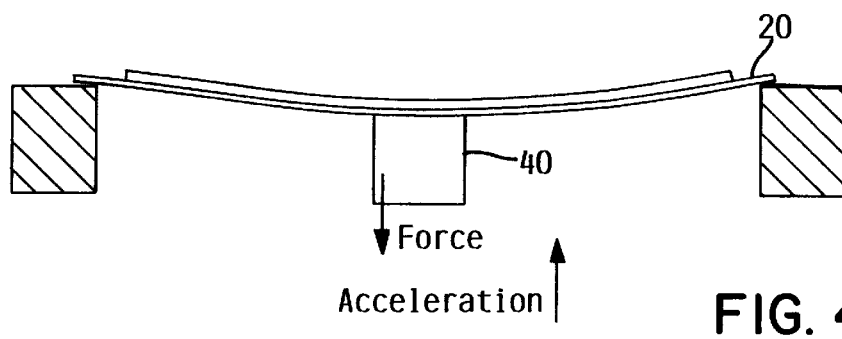
FIG. 4B shows a diagrammatic view of the invention in response to a vertical upward applied acceleration.
Figure 4C:
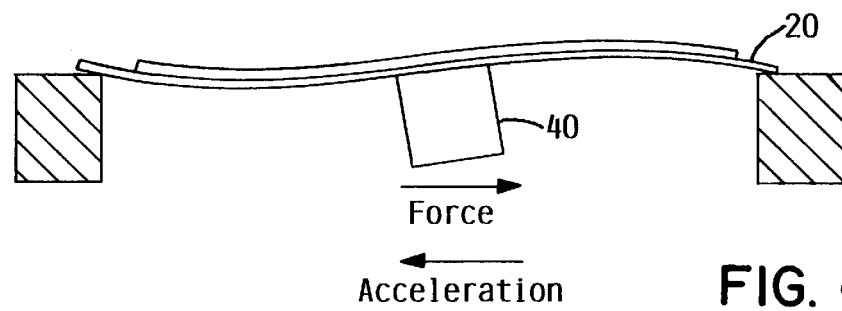
FIG. 4C shows a diagrammatic view of the invention in response to a right to left applied acceleration.
Figure 4D:
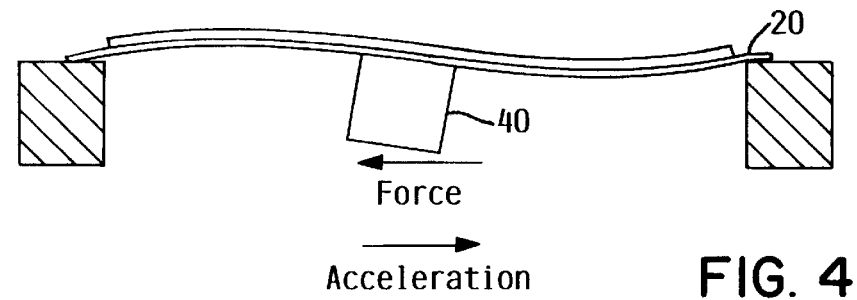
FIG. 4D shows a diagrammatic view of the invention in response to a left to right applied acceleration.

FIGS. 4A–4D diagrammatically illustrate the operation of the invention, particularly with respect to applied accelerations in various directions. FIG. 4A illustrates a downward acceleration which results in an upward reaction force against the apparatus. This causes the diaphragm 20 and its associated materials to deflect upwardly due to the upward force against weight 40. FIG. 4B illustrates a relative deflection of diaphragm 20 resulting from an upward acceleration of the device which causes a downward reaction force against weight 40 and a resultant downward deflection of diaphragm 20. FIG. 4C illustrates the nature of the deflection in response to an applied leftward acceleration of the apparatus. This causes a rightward-directed reaction force against the weight 20 and a skewed deflection of diaphragm 20, as shown. FIG. 4D illustrates a similar distortion of diaphragm 20, resulting from a rightward applied acceleration which causes a leftward reaction force against weight 40. In each of the foregoing examples, it is apparent that the piezoelectric material, as attached to or deposited on diaphragm 20 is physically distorted relative to the rest position; and this physical distortion causes an electrical signal to be generated over lines 51 and 61 to circuit 70.

In operation, the shock sensor 10 is placed in an environment for which a shock measurement is desired such as in a shipping container or similar type container. As the shock sensor is moved about, various forces will be developed to cause the weight 40 to deflect in response to the accelerations of the device. The deflection of weight 40 will cause a mechanical stress to be applied to the piezoelectric material deposited or attached to the diaphragm, and this stress will be transformed into an electrical signal which may be detected by an appropriate circuit and may be recorded as a function of time or other event. The electrical signals which are generated by the piezoelectric materials of the apparatus will be proportional to the magnitude of force applied and will be independent of the direction of this force.

The present invention may be embodied in other specific forms without departing from the spirit or essential attributes thereof; and it is, therefore, desired that the present embodiment be considered in all respects as illustrative and not restrictive, reference being made to the appended claims rather than to the foregoing description to indicate the scope of the invention.

What is claimed is:

1. An omnidirectional shock sensor for measuring acceleration in X, Y, Z axes, the sensor comprising:
   a) a base having a opening aligned along the Z axis;
   b) a diaphragm attached to said base over said opening and parallel to the X and Y axes, said diaphragm having a top and bottom surface;
   c) contiguous piezoelectric material attached to the top surface of said diaphragm;
   d) a proof mass attached to the bottom surface of said diaphragm and aligned along said Z axis; and
   e) a first electrically conductive layer centrally positioned on the piezoelectric material, and a second electrically conductive layer deposited on the piezoelectric material, the second electrically conductive layer being ring-shaped, concentric with, and extending around the first electrically conductive, the first and second conductive layers electrically connectable to a circuit whereby acceleration in any one of the X, Y, and Z axis generates an electrical signal whereby said acceleration may be detected.

2. The apparatus of claim 1, wherein said base further comprises a thickness along said Z axis at least as great as the Z axial dimension of said proof mass.

3. The apparatus of claim 2, wherein said diaphragm further comprises a metal diaphragm.

4. The apparatus of claim 3, wherein said diaphragm has a thickness of from 0.1 millimeters to 0.4 millimeters.

5. The apparatus of claim 1, wherein said piezoelectric material further comprises polyvinylidene fluoride.

6. The apparatus of claim 1, wherein said piezoelectric material further comprises copolymers of vinylidene fluoride.

7. The apparatus of claim 1, wherein said piezoelectric material further comprises copolymers of trifluoroethylene.

8. The apparatus of claim 1, wherein said piezoelectric material further comprises a polycrystalline ceramic.

9. The apparatus of claim 1, wherein said piezoelectric material further comprises a crystalline ceramic and lead metal oxide.

10. The apparatus of claim 1, further comprising conductive tabs on said base for forming a connection between said electrical conductors and said electric circuit.

11. The apparatus of claim 1, wherein said proof mass is a solid, cylindrically-shaped member.

12. The apparatus of claim one wherein the proof mass is attached to the bottom surface of the diaphragm and the piezoelectric material is attached to the top surface.

13. A shock sensor for measuring acceleration in X, Y, Z axes, the sensor comprising:
   a) a base having a circular opening extending along the Z axis;
   b) a diaphragm attached to said base over said opening and parallel to the X and Y axes, said diaphragm having a top and bottom surface;
   c) piezoelectric material attached to the top surface of said diaphragm;
   d) a proof mass attached to the bottom surface of said diaphragm and aligned along said Z axis, no symmetrical proof mass being attached to the top surface; and
   e) a first electrically conductive layer centrally positioned on the piezoelectric material, a second electrically conductive layer deposited on the piezoelectric material, the second electrically conductive layer being concentric with the first, the first and second conductive layers electrically connectable to a circuit whereby acceleration of the apparatus in any one of the X, Y, and Z axis generates an electrical signal whereby said acceleration may be detected.

* * * * *

UNITED STATES PATENT AND TRADEMARK OFFICE
CERTIFICATE OF CORRECTION

PATENT NO.   : 5,811,910
DATED        : September 22, 1998
INVENTOR(S)  : Graham P. Cameron, et al.

It is certified that error appears in the above-indentified patent and that said Letters Patent is hereby corrected as shown below:

Column 1, line 3, before the phrase "The present invention is related to an apparatus for . . ." insert the statement --
The present invention was made with government support under Contract Number F30602-95-C-0284 awarded by the U.S. Air Force, and the government has certain rights in this invention. --

Signed and Sealed this

Twenty-fifth Day of May, 1999

*Attest:*

Q. TODD DICKINSON

*Attesting Officer*   Acting Commissioner of Patents and Trademarks